(12) United States Patent
Kitahama et al.

(10) Patent No.: US 11,588,413 B2
(45) Date of Patent: Feb. 21, 2023

(54) POWER CONVERSION DEVICE

(71) Applicant: Mitsubishi Electric Corporation, Tokyo (JP)

(72) Inventors: Niki Kitahama, Tokyo (JP); Ryohei Hayashi, Tokyo (JP); Jiro Yoshizawa, Tokyo (JP); Yasuhiro Komiya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 169 days.

(21) Appl. No.: 17/130,265

(22) Filed: Dec. 22, 2020

(65) Prior Publication Data

US 2021/0273575 A1 Sep. 2, 2021

(30) Foreign Application Priority Data

Feb. 28, 2020 (JP) .............................. JP2020-032612

(51) Int. Cl.
*H02M 7/00* (2006.01)
*H05K 7/20* (2006.01)
(Continued)

(52) U.S. Cl.
CPC .......... *H02M 7/003* (2013.01); *H01L 23/473* (2013.01); *H02K 11/33* (2016.01); *H02M 7/48* (2013.01);
(Continued)

(58) Field of Classification Search
CPC ........... H05K 7/20927; H05K 7/20909; H05K 7/209; H05K 7/20218; H05K 7/20254; H05K 7/1432; H05K 7/20509; H05K 7/2089; H02P 27/06; H02M 7/48; H02M 7/003; H02M 3/003; H02M 1/44;
(Continued)

(56) References Cited

U.S. PATENT DOCUMENTS 6,320,776 B1 * 11/2001 Kajiura ................. H02M 7/003
361/709
2009/0231811 A1 * 9/2009 Tokuyama ........... H05K 1/0262
361/699
(Continued)

FOREIGN PATENT DOCUMENTS

JP 2018-121457 A 8/2018

*Primary Examiner* — Adam B Dravininkas
(74) *Attorney, Agent, or Firm* — Sughrue Mion, PLLC; Richard C. Turner (57) ABSTRACT

Obtained is a power conversion device that suppresses size increase thereof while improving cooling performance for a smoothing capacitor. The power conversion device includes: a cooler having a cooling surface on an outer side thereof and a flow path on an inner side thereof, the flow path being formed such that a coolant flows through the flow path; and a smoothing capacitor fixed to the cooler, the smoothing capacitor being thermally connected to the cooling surface with a heat transfer member therebetween and configured to smooth DC power. A thickness of the heat transfer member between the smoothing capacitor and a portion, of the cooling surface, to which the smoothing capacitor is thermally connected is set to be smaller than a wall thickness of the cooler between the flow path and the portion, of the cooling surface, to which the smoothing capacitor is thermally connected.

17 Claims, 11 Drawing Sheets

(51) Int. Cl.
  *H01L 23/473* (2006.01)
  *H02M 7/48* (2007.01)
  *H02K 11/33* (2016.01)
(52) U.S. Cl.
  CPC ......... *H05K 7/209* (2013.01); *H05K 7/20218* (2013.01); *H05K 7/20927* (2013.01)
(58) Field of Classification Search
  CPC ...... H02M 1/327; H02K 11/33; H01L 23/473; H01L 23/46
  See application file for complete search history.

(56) References Cited

U.S. PATENT DOCUMENTS

| | | | | |
|---|---|---|---|---|
| 2011/0007480 | A1* | 1/2011 | Souda | H01G 11/18 |
| | | | | 361/728 |
| 2017/0194878 | A1* | 7/2017 | Jones | H02M 3/158 |
| 2019/0126773 | A1* | 5/2019 | Chung | B60L 15/007 |

* cited by examiner

POWER CONVERSION DEVICE

BACKGROUND OF THE INVENTION

1. Field of the Invention

The present disclosure relates to a power conversion device.

2. Description of the Background Art

A plurality of power conversion devices are mounted in electric vehicles using a motor as a drive source, such as electric automobiles or hybrid automobiles. Examples of the power conversion devices include: a commercially-available charger for converting AC power into DC power and charging a high-voltage battery with the DC power; a DC/DC converter for converting DC power of a high-voltage battery into voltage (for example, 12V) for an auxiliary device battery; and an inverter for converting DC power from a battery into AC power for a motor; and the like.

In recent years, in association with widespread use of electric vehicles, size reduction and integration have been required for power conversion devices for the purpose of, for example, reducing mounting spaces for the power conversion devices to be provided in electric vehicles. In addition, many electronic parts have been used inside power conversion devices for use in electric vehicles, and, in association with demand for increase in output, the insides of the power conversion devices have been exposed to a high-temperature environment owing to heat-generating parts such as capacitors and semiconductor elements. In view of this, the power conversion devices are required to efficiently cool these heat-generating electrical parts. Furthermore, power conversion devices are required to be applied to harsh mounting environments such as a mounting environment near an engine, or the like, and it is necessary to improve cooling performance while suppressing size increase of the power conversion devices in order to mount the power conversion devices in limited spaces inside vehicles.

For improving cooling performance while suppressing size increase of a power conversion device, the following structure has been disclosed: a structure of a power conversion device including a smoothing capacitor in which a capacitor cell and a conductor portion are accommodated in a case, the conductor portion being in contact with a housing with an insulation member therebetween in the midst of the conductor portion extending from the case (for example, see Patent Document 1).

Patent Document 1: Japanese Laid-Open Patent Publication No. 2018-121457

In the above-described Patent Document 1, the conductor portion is in contact with the housing with the insulation member therebetween. Thus, heat received from outside and heat generated by the capacitor cell can be dissipated to the housing via the location of the contact of the conductor portion, whereby the smoothing capacitor can be cooled. However, since the smoothing capacitor is formed with the capacitor cell and the conductor portion being accommodated in the case, and the smoothing capacitor, inclusive of the case, is disposed inside the housing of the power conversion device, a problem arises in that size increase of the power conversion device is not suppressed.

In addition, although the conductor portion is in contact with the housing with the insulation member therebetween, the location of the contact of the conductor portion and a flow path for cooling are apart from each other, and thus a problem arises in that the smoothing capacitor cannot be efficiently cooled. Furthermore, the capacitor cell is accommodated in the case and apart from the housing and the flow path, and thus a problem arises in that the capacitor cell cannot be efficiently cooled.

SUMMARY OF THE INVENTION

Considering the above, an object of the present disclosure is to obtain a power conversion device capable of suppressing size increase thereof while improving cooling performance for a smoothing capacitor.

A power conversion device according to the present disclosure is a power conversion device including: a cooler having a cooling surface on an outer side thereof and a flow path on an inner side thereof, the flow path being formed such that a coolant flows through the flow path; and a smoothing capacitor fixed to the cooler, the smoothing capacitor being thermally connected to the cooling surface with a heat transfer member therebetween and configured to smooth DC power, wherein a thickness of the heat transfer member between the smoothing capacitor and a portion, of the cooling surface, to which the smoothing capacitor is thermally connected is set to be smaller than a wall thickness of the cooler between the flow path and the portion, of the cooling surface, to which the smoothing capacitor is thermally connected.

In the power conversion device according to the present disclosure, it is not necessary to fix the smoothing capacitor to the cooler with a case therebetween as in Patent Document 1. Thus, no case is needed, and size increase of the power conversion device can be suppressed. In addition, heat from the smoothing capacitor can be transferred to the cooling surface via the heat transfer member, whereby the smoothing capacitor can be efficiently cooled. In addition, the thickness of the heat transfer member between the smoothing capacitor and the portion, of the cooling surface, to which the smoothing capacitor is thermally connected is set to be smaller than the wall thickness of the cooler between the flow path and the portion, of the cooling surface, to which the smoothing capacitor is thermally connected. Thus, heat from the smoothing capacitor can be more efficiently transferred to the cooling surface, whereby cooling performance for the smoothing capacitor can be enhanced.

DETAILED DESCRIPTION OF THE PREFERRED EMBODIMENTS OF THE INVENTION

Hereinafter, a power conversion device according to an embodiment of the present disclosure will be described with reference to the drawings. Description will be given while the same or corresponding members and portions in the drawings are denoted by the same reference characters.

First Embodiment

Figure 1:
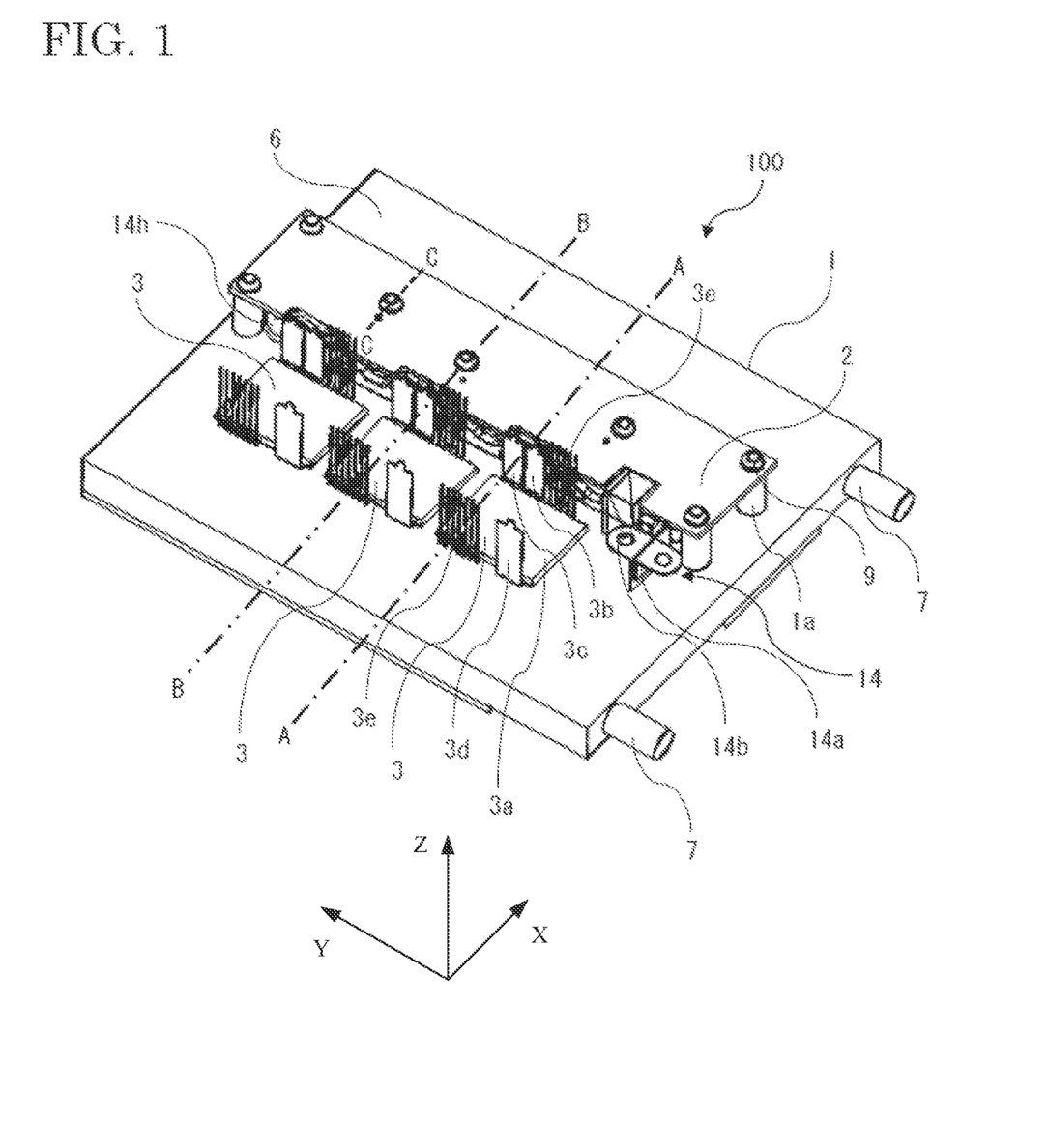
FIG. 1 is a schematic perspective view of a power conversion device according to a first embodiment.
Figure 2:
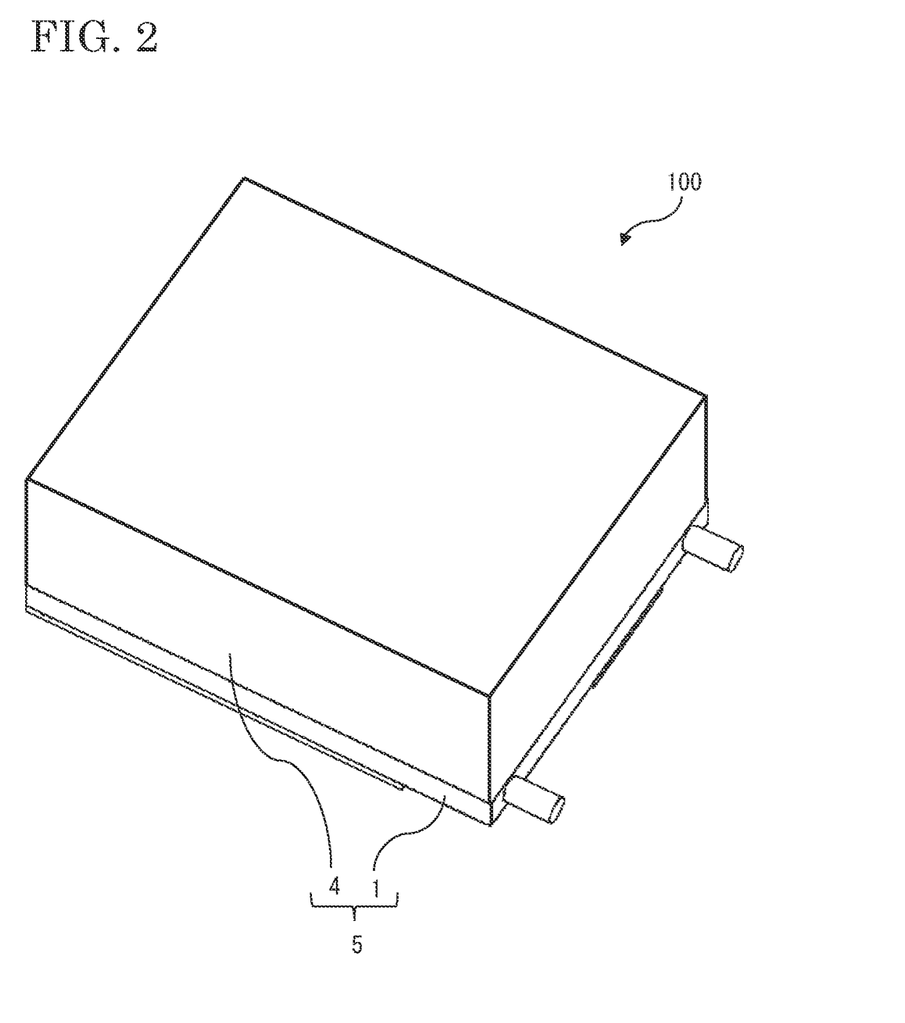
FIG. 2 is a schematic perspective view of the outer appearance of the power conversion device according to the first embodiment.
Figure 3:
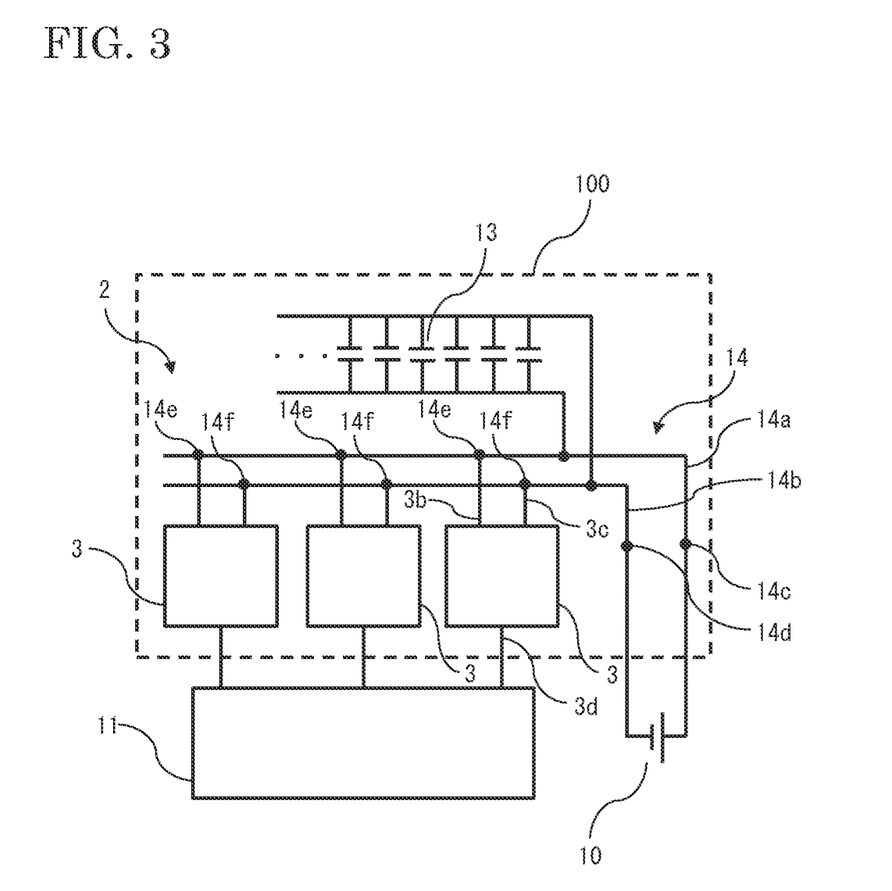
FIG. 3 is a schematic circuit diagram of the power conversion device according to the first embodiment.
Figure 4:
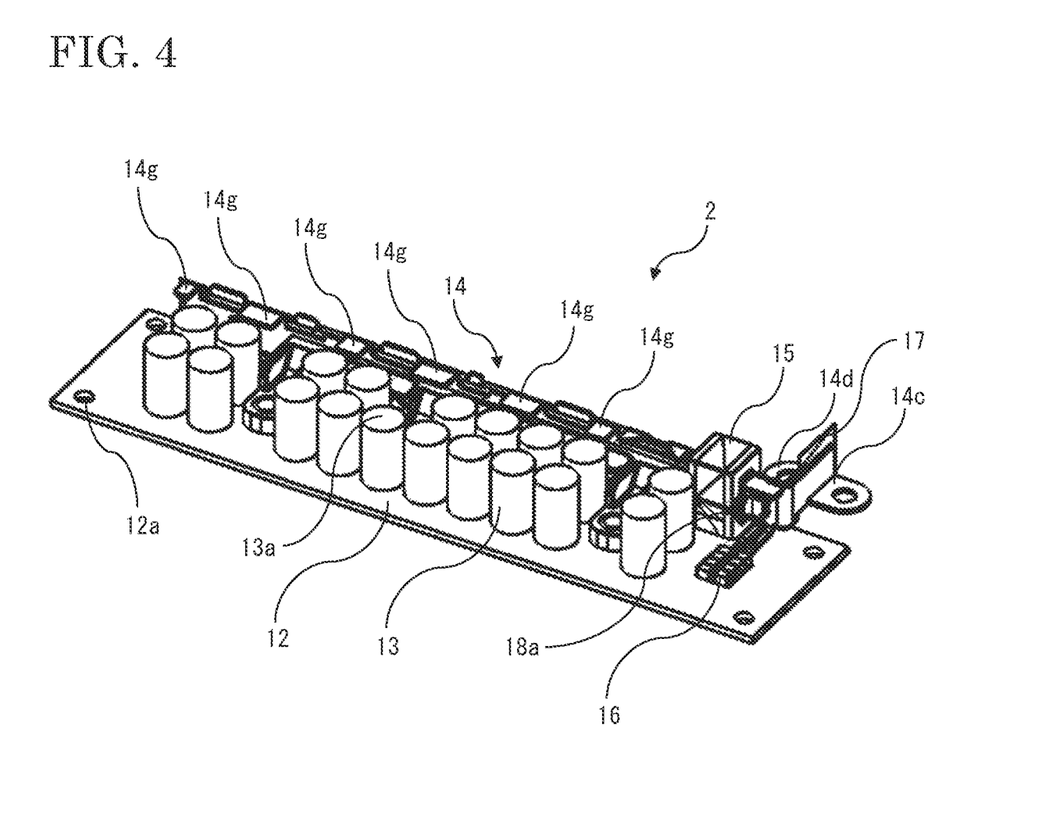
FIG. 4 is a perspective view of a smoothing capacitor of the power conversion device according to the first embodiment.
Figure 5:
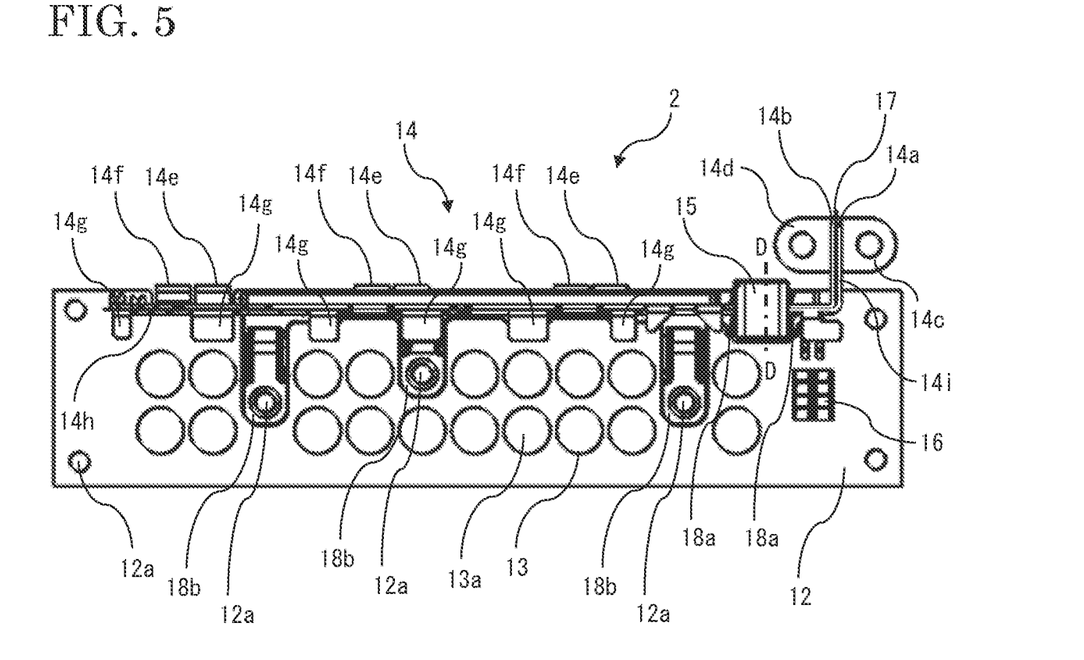
FIG. 5 is a plan view of the smoothing capacitor of the power conversion device according to the first embodiment.
Figure 6:
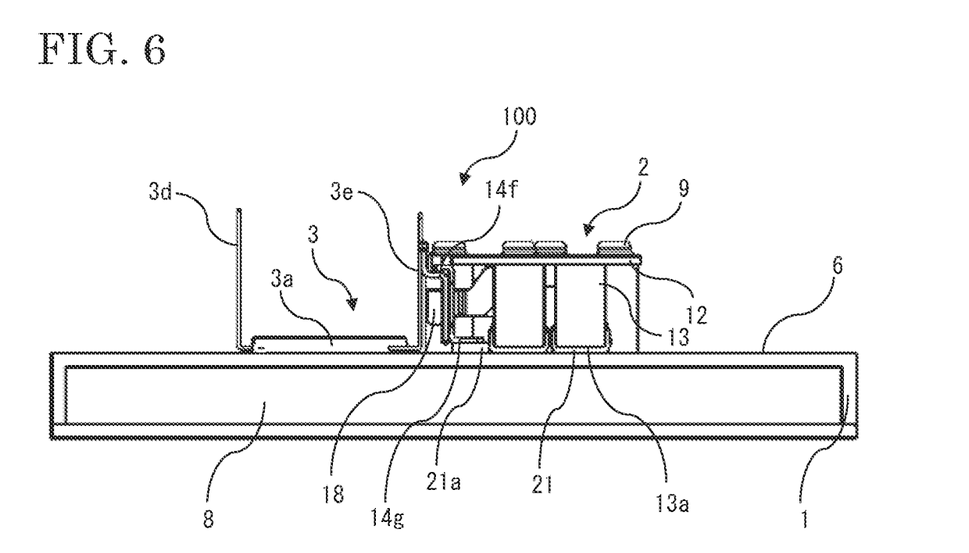
FIG. 6 is a cross-sectional view of a major portion of the power conversion device taken at the cross-sectional position A-A in FIG. 1.
Figure 7:
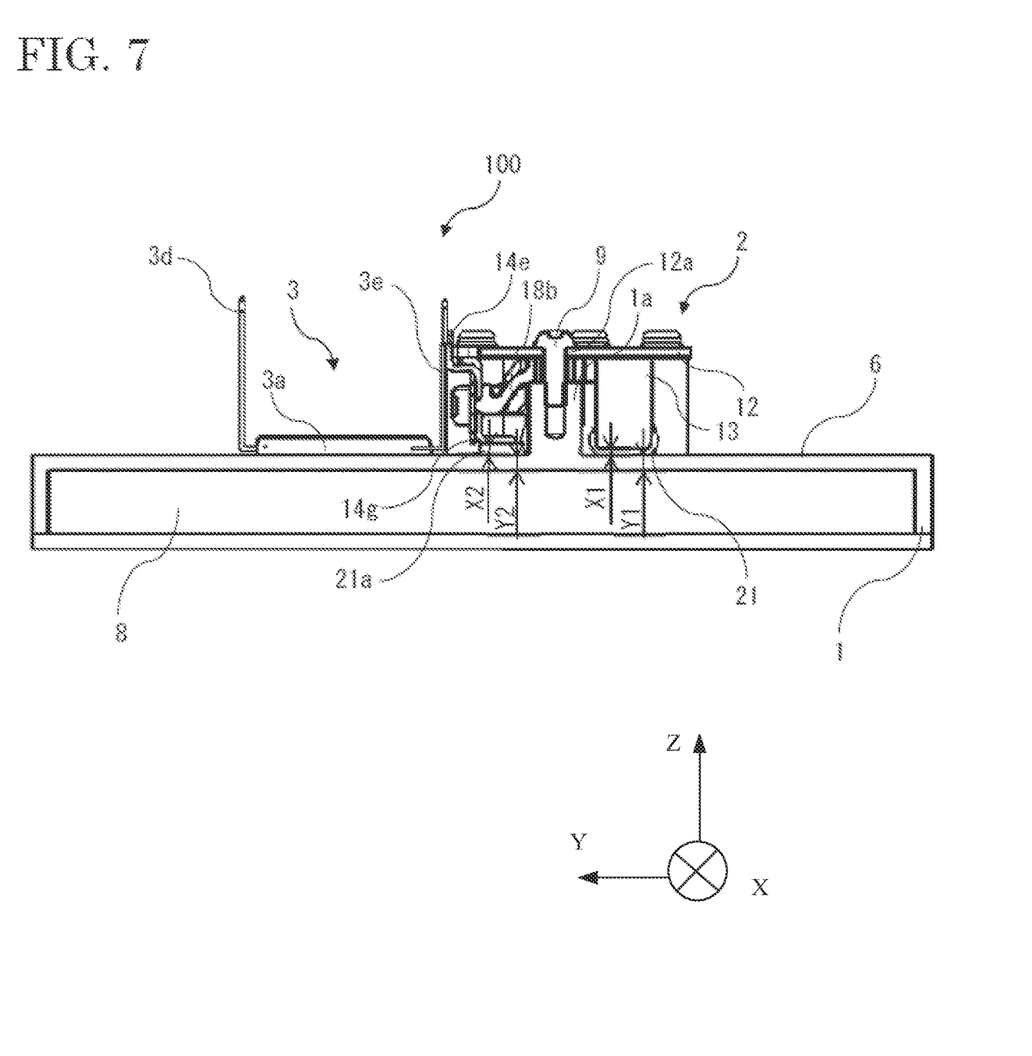
FIG. 7 is a cross-sectional view of the major portion of the power conversion device taken at the cross-sectional position B-B in FIG. 1.
Figure 10:
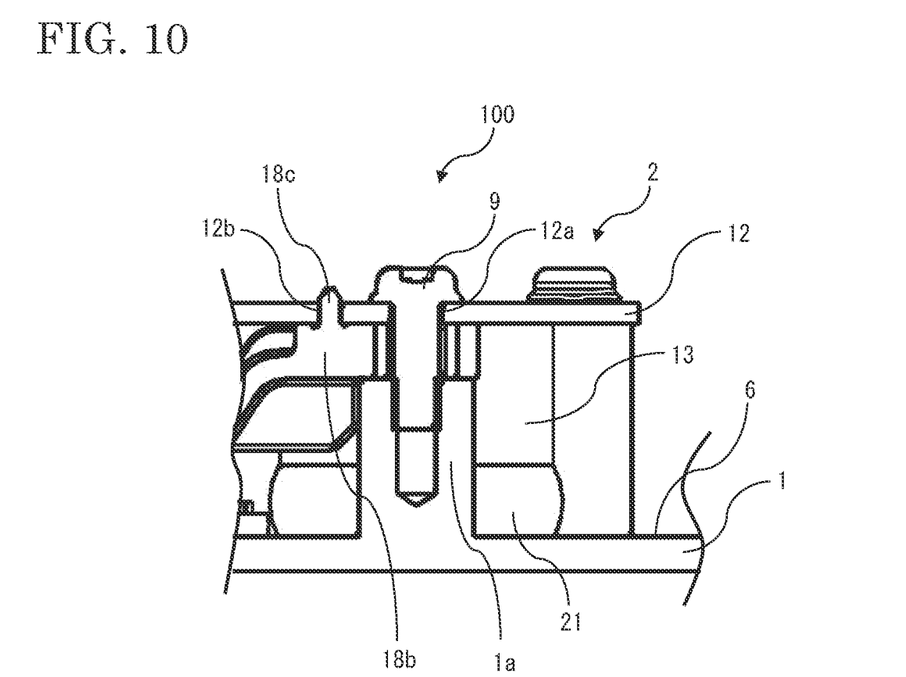
FIG. 10 is a cross-sectional view of the major portion of the power conversion device taken at the cross-sectional position C-C in FIG. 1.
Figure 11:
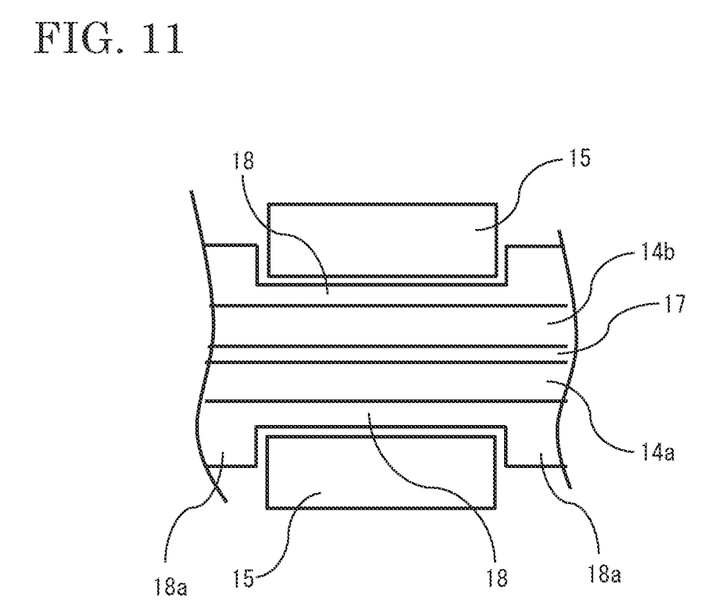
FIG. 11 is a cross-sectional view of the major portion of the power conversion device taken at the cross-sectional position E-E in FIG. 8.

FIG. 1 is a schematic perspective view of a power conversion device 100 from which a housing lid 4 has been removed. The schematic perspective view includes orthogonal directions X, Y, and Z. FIG. 2 is a schematic perspective view of the outer appearance of the power conversion device 100. FIG. 3 is a schematic circuit diagram of the power conversion device 100. FIG. 4 is a perspective view of a smoothing capacitor 2. FIG. 5 is a plan view of the smoothing capacitor 2. FIG. 6 is a cross-sectional view of a major portion of the power conversion device 100 taken at the cross-sectional position A-A in FIG. 1. FIG. 7 is a cross-sectional view of the major portion of the power conversion device 100 taken at the cross-sectional position B-B in FIG. 1. Cross-sectional position B-B runs in the X direction. FIG. 10 is a cross-sectional view of the major portion of the power conversion device 100 taken at the cross-sectional position C-C in FIG. 1. FIG. 11 is a cross-sectional view of the major portion of the power conversion device 100 taken at the cross-sectional position E-E in FIG. 8.

The power conversion device 100 performs power conversion on DC power and outputs the resultant power. As shown in FIG. 2, in the power conversion device 100, a housing lid 4 is attached to a cooler 1 by means of, for example, screws (not shown), and a housing 5 is formed by the cooler 1 and the housing lid 4. The power conversion device 100 is mounted in a vehicle. FIG. 2 does not show any openings for input and output with respect to the power conversion device 100.

As shown in FIG. 1, the power conversion device 100 includes the cooler 1, the smoothing capacitor 2, and power modules 3. The smoothing capacitor 2 and the power modules 3 are not directly fixed to the housing lid 4 shown in FIG. 2.

<Circuit Configuration>

The smoothing capacitor 2 smooths DC power. In the present embodiment, as shown in FIG. 4, the smoothing capacitor 2 includes a substrate 12 and a plurality of capacitor cells 13 mounted on the substrate 12. The smoothing capacitor 2 includes, in addition to the substrate 12 and the capacitor cells 13, a plate-shaped power-feeding busbar 14 electrically connected to the plurality of capacitor cells 13 via the substrate 12. As shown in FIG. 5, the power-feeding busbar 14 includes two busbars, i.e., a positive-side busbar 14a and a negative-side busbar 14b. The substrate 12, the capacitor cells 13, the power-feeding busbar 14, and the like are integrated with one another in the form of a module. Since these components are integrated with one another, size increase of the power conversion device 100 is suppressed as compared to the case where these components are individually provided to the power conversion device 100. In addition, if the substrate 12, the capacitor cells 13, and the power-feeding busbar 14 are integrated with one another, the number of steps for assembling the power conversion device 100 is reduced and assembling workability is improved. Accordingly, the power conversion device 100 can be manufactured at low cost. The power-feeding busbar 14 does not have to be a module constituent of the smoothing capacitor 2 and may be a part separated from the smoothing capacitor 2.

The power modules 3 include semiconductor switching elements. As shown in FIG. 1, the power modules 3 are electrically connected to the power-feeding busbar 14.

In the present embodiment, as shown in FIG. 3, the power conversion device 100 is an inverter for converting DC power into AC power and supplying the AC power to a three-phase AC motor 11. The power-feeding busbar 14 includes the positive-side busbar 14a and the negative-side busbar 14b. The power-feeding busbar 14 is connected at a positive terminal 14c and a negative terminal 14d thereof to a DC power supply 10 provided outside the power conversion device 100. The plurality of (in the present example, 19) capacitor cells 13 are connected in parallel between the positive-side busbar 14a and the negative-side busbar 14b. The plurality of (in the present example, three) power modules 3 are connected in parallel at positive connection terminals 14e and negative connection terminals 14f thereof between the positive-side busbar 14a and the negative-side busbar 14b. Each power module 3 is provided with two semiconductor switching elements connected in series. The connection point between the two semiconductor switching elements of each power module 3 is connected to a winding for a corresponding phase in the three-phase AC motor 11. A terminal for control such as the gate terminal of each semiconductor switching element is connected to a control circuit (not shown).

As shown in FIG. 1, the power module 3 includes: a rectangular plate-shaped body portion 3a in which circuits of the semiconductor switching elements and the like are sealed by means of resin; and a plurality of terminals extended from the body portion 3a. The plurality of terminals are: a positive-side terminal 3b connected to the positive-side busbar 14a; a negative-side terminal 3c connected to the negative-side busbar 14b; a winding connection terminal 3d connected to the winding; and a control terminal 3e connected to the control circuit (not shown).

<Cooler 1>

The cooler 1 has a cooling surface 6 on an outer side thereof and a flow path 8 (not shown in FIG. 1) on an inner side thereof, the flow path 8 being formed such that a coolant flows through the flow path 8. The coolant is a fluid, and flows in and out from two pipes 7 provided to a side surface of the cooler 1. As the coolant, for example, water or ethylene glycol liquid is used. The cooling surface 6 is cooled by the coolant. The cooler 1 is produced by die casting from, for example, aluminum.

In the present embodiment, the cooler 1 is formed such that the exterior shape thereof is the shape of a rectangular parallelepiped-like (in the present example, rectangular plate-like) box. One surface (a surface on a side to be covered by the housing lid 4) of the rectangular parallelepiped-like cooler 1 serves as the cooling surface 6. The smoothing capacitor 2 and the power modules 3 are thermally connected to the cooling surface 6. The internal space of the cooler 1 serves as the flow path 8. However, the flow path 8 may take another form. For example, a tubular flow path that makes connection between the two pipes 7 may be used, and fins may be provided inside or outside the flow path 8.

<Smoothing Capacitor 2>

As shown in FIG. 6, the smoothing capacitor 2 is fixed to the cooler 1 and thermally connected to the cooling surface 6 with heat transfer members 21 therebetween. With this configuration, it is not necessary to fix the smoothing capacitor 2 to the cooler 1 with a case therebetween as in Patent Document 1. Thus, no case is needed, and size increase of the power conversion device 100 can be suppressed. The heat transfer members 21 are, for example, each a heat dissipation sheet or a heat dissipation compound but is not limited thereto.

In the present embodiment, the substrate 12 is fixed to the cooler 1, and the plurality of capacitor cells 13 are thermally connected to the cooling surface 6 with the heat transfer members 21 therebetween. With this configuration, it is not necessary to provide, to each of the plurality of capacitor cells 13, a portion to be fixed to the cooler 1. Instead, the plurality of capacitor cells 13 can be efficiently fixed to the cooler 1 by using the substrate 12 on which the plurality of capacitor cells 13 are mounted. In addition, the capacitance of the smoothing capacitor 2 can be shared among the plurality of capacitor cells 13. In the present embodiment, the number of the plurality of capacitor cells 13 provided is 19, and low-capacitance capacitor cells 13 can be used. In addition, since the plurality of capacitor cells 13 are provided, the surface area of the capacitor cells 13 can be increased, whereby heat dissipation property to the cooling surface 6 can be improved. The number of the plurality of capacitor cells 13 only has to be two or more. If, for example, ten or more capacitor cells are provided, the above-described advantageous effects can be more improved.

The substrate 12 is disposed so as to be apart from the cooling surface 6, and the plurality of capacitor cells 13 are disposed between the substrate 12 and the cooling surface 6. As shown in FIG. 7, the cooler 1 includes protruding portions 1*a* protruding from the cooling surface 6, and the substrate 12 is fixed to the protruding portions 1*a*. In the present example, the substrate 12 is fixed to the protruding portions 1*a* by means of fastening members 9 (in the present example, screws) by using screw holes 12*a* provided in the substrate 12. The plurality of capacitor cells 13 are thermally connected to the cooling surface 6 with the heat transfer members 21 therebetween.

With this configuration, the substrate 12 which is low in terms of necessity to be cooled can be disposed so as to be apart from the cooling surface 6, and the capacitor cells 13 can be disposed close to the cooling surface 6. Therefore, the cooling performance for the capacitor cells 13 can be improved.

The substrate 12 is formed so as to have the shape of a flat plate. A portion, of the cooling surface 6, to which the smoothing capacitor 2 is thermally connected is formed so as to have the shape of a flat surface. The substrate 12 is disposed parallel to the cooling surface 6 so as to be apart from the cooling surface 6. Each capacitor cell 13 has the shape of a column (in the present example, a circular column), and the plurality of capacitor cells 13 are arranged along the cooling surface 6 and the substrate 12. The columnar capacitor cell 13 is disposed such that the side surface thereof is perpendicular to the cooling surface 6 and the substrate 12. One bottom surface of the columnar capacitor cell 13 faces a surface, of the substrate 12, that is located on the cooling surface 6 side. A terminal (not shown) provided to the one bottom surface is electrically connected to the substrate 12. As shown in FIG. 6, a flat surface portion 13*a* which is the other bottom surface of the capacitor cell 13 faces the cooling surface 6. The heat transfer members 21 are interposed between the flat surface portions 13*a* and the cooling surface 6.

With this configuration, the plurality of columnar capacitor cells 13 are arranged in a vertical state between the cooling surface 6 and the substrate 12. Accordingly, the capacitor cells 13 can be set to have small arrangement areas and can be efficiently disposed, and the area of heat transfer to the cooling surface 6 can be increased by the flat surface portions 13*a* of the columnar capacitor cells 13.

The plurality of capacitor cells 13 have shapes identical to one another. The heat transfer members 21 are individually provided to the plurality of capacitor cells 13, respectively. It is noted that the heat transfer members 21 may be in the form of one sheet that is common to the plurality of capacitor cells 13.

As described later, the power-feeding busbar 14 has, as shown in FIG. 5, a linear portion 14*h* which extends linearly. The linear portion 14*h* extends along the cooling surface 6. The plurality of capacitor cells 13 are arranged along the linear portion 14*h* of the power-feeding busbar 14. With this configuration, even if many capacitor cells 13 are provided, each capacitor cell 13 can be efficiently disposed with the plurality of capacitor cells 13 being arranged along the linear portion 14*h* of the power-feeding busbar 14.

The plurality of capacitor cells 13 are arranged along the linear portion 14*h* of the power-feeding busbar 14 so as to be in a region, of the cooling surface 6, that is located on one side of the linear portion 14*h* of the power-feeding busbar 14. In the present example, 19 capacitor cells 13 are arranged in two rows along the linear portion 14*h* of the power-feeding busbar 14 so as to be in the region, of the cooling surface 6, that is located on one side of the linear portion 14*h*.

In addition, as shown in FIG. 1, the plurality of (in the present example, three) power modules 3 are arranged along the linear portion 14*h* of the power-feeding busbar 14 so as to be in a region, of the cooling surface 6, that is located on another side of the linear portion 14*h* of the power-feeding busbar 14, and are connected to the linear portion 14*h* of the power-feeding busbar 14. With this configuration, the plurality of capacitor cells 13 and the plurality of power modules 3 can be efficiently disposed by effectively using the regions, of the cooling surface 6, that are located on both sides of the linear portion 14*h* of the power-feeding busbar 14. Accordingly, the size of the power conversion device 100 can be reduced.

<Power-Feeding Busbar 14>

As shown in FIG. 5, the power-feeding busbar 14 includes: the positive-side busbar 14*a*; the negative-side busbar 14*b*; and an insulation member 17 provided between the positive-side busbar 14*a* and the negative-side busbar 14*b*. The insulation member 17 is provided to prevent short-circuiting between the positive-side busbar 14*a* and the negative-side busbar 14*b*. By providing the insulation member 17 between the positive-side busbar 14*a* and the negative-side busbar 14*b*, short-circuiting between the positive-side busbar 14*a* and the negative-side busbar 14*b* can be easily prevented. Here, an insulation paper sheet as the insulation member 17 is interposed between the positive-side busbar 14a and the negative-side busbar 14b which are disposed parallel to each other. The arrangement of the positive-side busbar 14a and the negative-side busbar 14b, and the material of the insulation member 17, are not limited thereto. The insulation member 17 may be made of, for example, a resin material. If an insulation paper sheet is used as the insulation member 17, the insulation member 17 can be made thin, and thus the size of the power-feeding busbar 14 can be reduced.

As shown in FIG. 3, the power-feeding busbar 14 receives DC power from the DC power supply 10 provided outside the power conversion device 100, and is connected to the power modules 3. As shown in FIG. 5, the power-feeding busbar 14 includes: the linear portion 14h which extends linearly; and power supply connection portions 14i which are bent from the linear portion 14h. The power supply connection portion 14i of the positive-side busbar 14a is provided with the positive terminal 14c connected to the positive side of the DC power supply 10, and the power supply connection portion 14i of the negative-side busbar 14b is provided with the negative terminal 14d connected to the negative side of the DC power supply 10.

The linear portion 14h of the power-feeding busbar 14 includes, at the location of each of the power modules 3 disposed along the linear portion 14h, the positive connection terminal 14e and the negative connection terminal 14f which are connected to the power module 3. Therefore, three pairs of positive connection terminals 14e and negative connection terminals 14f are provided correspondingly to the three power modules 3.

Figure 8:
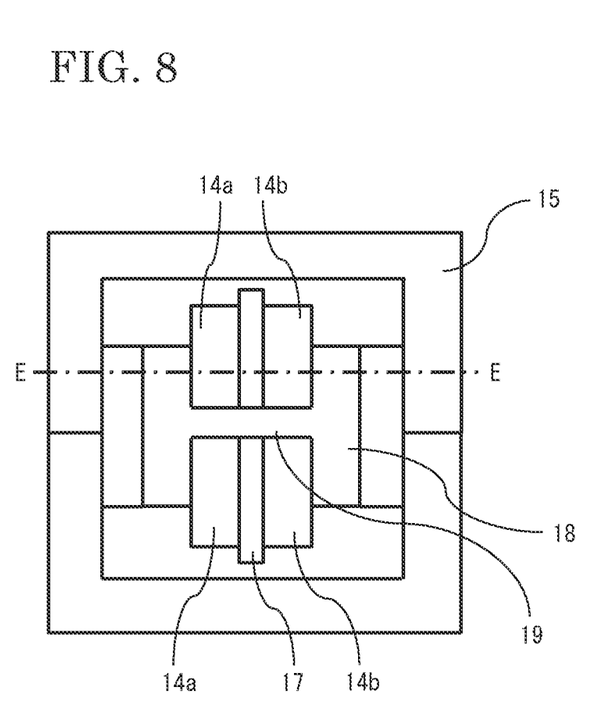
FIG. 8 is a cross-sectional view of the major portion taken at the cross-sectional position D-D in FIG. 5.

Integration between the positive-side busbar 14a, the negative-side busbar 14b, and the insulation member 17 by a resin member 18 will be described. The positive-side busbar 14a, the negative-side busbar 14b, and the insulation member 17 are molded integrally with each other by the resin member 18. FIG. 8 is a cross-sectional view of the major portion taken at the cross-sectional position D-D in FIG. 5. The resin member 18 is provided also to a through-hole 19 which penetrates each of the positive-side busbar 14a, the negative-side busbar 14b, and the insulation member 17. If the positive-side busbar 14a, the negative-side busbar 14b, and the insulation member 17 are integrated with each other through molding, the number of steps for assembling the power-feeding busbar 14 is reduced, whereby the power-feeding busbar 14 can be produced at low cost.

The resin member 18 is fixed to the cooler 1. As shown in FIG. 5, the power-feeding busbar 14 is disposed on an end side of the substrate 12. The resin member 18 includes fixation portions 18b extending to the center side of the substrate 12 from portions, of the resin member 18, at which integral molding of the power-feeding busbar 14 has been made. The fixation portions 18b are located so as to coincide with the screw holes 12a provided in the substrate 12. The fixation portions 18b are, together with the substrate 12, fixed to the cooler 1. As shown in FIG. 7, the resin member 18 is, together with the substrate 12, fixed at the fixation portions 18b to the cooler 1 by means of the fastening members 9. Here, the fixation portions 18b are provided at three locations on the resin member 18, and the resin member 18 is fixed to the cooler 1 at the three locations. By fixing the resin member 18 to the cooler 1, the vibration resistance of the power-feeding busbar 14 is improved. Here, the resin member 18 is, together with the substrate 12, fastened with screws to be fixed to the cooler 1. However, the fixation method for the resin member 18 is not limited thereto, and the resin member 18 and the substrate 12 may be separately fixed to the cooler 1.

As shown in FIG. 10, each fixation portion 18b includes a projection 18c fitted into a through-hole 12b provided in the substrate 12. The resin member 18 is attached to the substrate 12 by fitting the through-hole 12b and the projection 18c to each other. By fitting the through-hole 12b and the projection 18c to each other, the location of the resin member 18, and thus the power-feeding busbar 14, is determined relative to the substrate 12, and the resin member 18 is provisionally fixed to the substrate 12. Therefore, it is possible to easily mount the power-feeding busbar 14 to the substrate 12 through soldering or the like.

Figure 9:
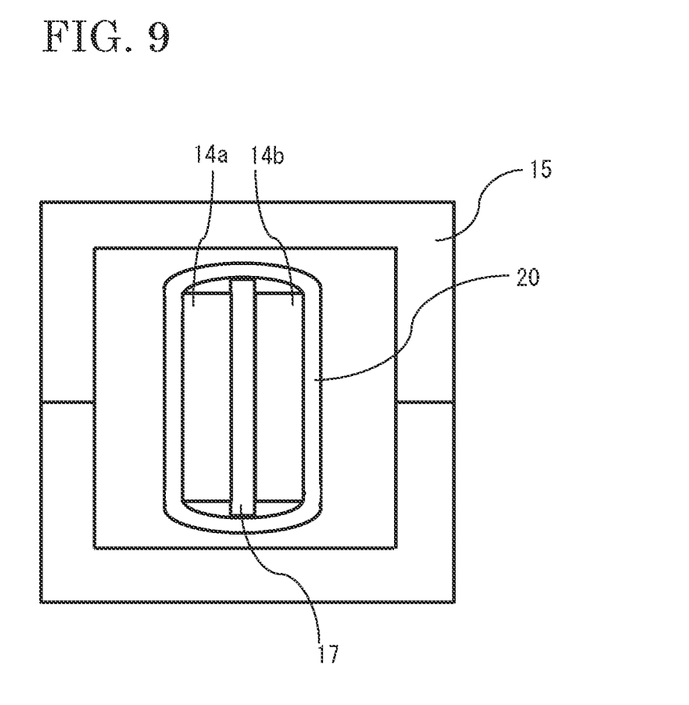
FIG. 9 is a cross-sectional view of the major portion taken at the cross-sectional position D-D in FIG. 5.

As shown in FIG. 5, the smoothing capacitor 2 includes a magnetic core 15 enclosing the periphery of the positive-side busbar 14a and the negative-side busbar 14b. The magnetic core 15 is a part for suppressing radio wave noise generated from the power conversion device 100, and, for example, a ferrite core is used. As shown in FIG. 11, positioning portions 18a each formed by the resin member 18 are provided to side surfaces on both sides of the magnetic core 15, and the magnetic core 15 is positioned by the resin member 18. The power-feeding busbar 14 is stably enclosed by the magnetic core 15 positioned by the resin member 18, whereby radio wave noise generated from the power conversion device 100 is efficiently suppressed. It is noted that the integration between the positive-side busbar 14a, the negative-side busbar 14b, and the insulation member 17 is not limited to integration through molding, and, as shown in FIG. 9, the positive-side busbar 14a, the negative-side busbar 14b, and the insulation member 17 may be integrated with each other by winding an annularly formed resin member 20 thereon.

The smoothing capacitor 2 includes a noise-removing capacitor 16 mounted on the substrate 12. The noise-removing capacitor 16 is disposed on the input side of the power conversion device 100 for the purpose of removing switching noise.

<Cooling Mechanism>

Thermal connection of the smoothing capacitor 2 which is a major portion of the present disclosure to the cooler 1 will be described. As described above, the smoothing capacitor 2 is thermally connected to the cooling surface 6 with the heat transfer members 21 therebetween. In the present embodiment, the plurality of capacitor cells 13 are thermally connected to the cooling surface 6 with the heat transfer members 21 therebetween. The flow path 8 through which the coolant flows is formed on the inner side of portions, of the cooling surface 6, to which the plurality of capacitor cells 13 are thermally connected.

As shown in FIG. 7, a thickness X1 of each heat transfer member 21 between the corresponding capacitor cell 13 and a portion, of the cooling surface 6, to which the capacitor cell 13 is thermally connected is smaller than a wall thickness Y1 of the cooler 1 between the flow path 8 and the portion, of the cooling surface 6, to which the capacitor cell 13 is thermally connected. The cooling surface is substantially parallel to a plane including the X direction and the Y direction. The thickness X1 and the thickness Y1 are measured in the Z direction, perpendicular to the plane of the cooling surface 6. A material used for the cooler 1 such as, for example, aluminum has a higher thermal conductivity than the heat transfer member 21. Considering this, the thickness X1 of the heat transfer member 21 is set to be smaller than the wall thickness Y1 of the cooler 1, whereby heat from the smoothing capacitor 2 is more efficiently transferred to the cooling surface 6 and thus can be efficiently cooled. In addition, the capacitor cell 13 which is a heat-generating member is directly thermally connected to the cooling surface 6 with the heat transfer member 21 therebetween, whereby heat accumulated in the smoothing capacitor 2 is efficiently cooled.

In the present embodiment, the power-feeding busbar 14 is thermally connected to the cooling surface 6 with a busbar heat transfer member 21*a* therebetween. The flow path 8 through which the coolant flows is formed on the inner side of a portion, of the cooling surface 6, to which the power-feeding busbar 14 is thermally connected. The power-feeding busbar 14 includes cooling portions 14*g* extending parallel to the cooling surface 6 from the linear portion 14*h*. The busbar heat transfer member 21*a* is disposed between the cooling portions 14*g* and the cooling surface 6. The cooling portions 14*g* are provided at a plurality of locations along the linear portion 14*h*. Accordingly, the linear portion 14*h* of the power-feeding busbar 14 can be cooled over the entirety thereof.

A thickness X2 of the heat transfer member 21*a* between the power-feeding busbar 14 (cooling portion 14*g*) and a portion, of the cooling surface 6, to which the power-feeding busbar 14 (cooling portion 14*g*) is thermally connected is smaller than a wall thickness Y2 of the cooler 1 between the flow path 8 and the portion, of the cooling surface 6, to which the power-feeding busbar 14 (cooling portion 14*g*) is thermally connected. The wall thickness Y1 of the cooler 1 and the wall thickness Y2 of the cooler 1 are set to be the same thickness.

If the thickness X2 of the busbar heat transfer member 21*a* is set to be smaller than the wall thickness Y2 of the cooler, heat from the power-feeding busbar 14 is more efficiently transferred to the cooling surface 6 and thus can be efficiently cooled. Since the power-feeding busbar 14 which is a heat-generating member is directly thermally connected to the cooling surface 6 with the heat transfer member 21*a* therebetween, heat generated from the power-feeding busbar 14 is efficiently cooled. In addition, by improving cooling performance for the capacitor cells 13 and the power-feeding busbar 14, output of the power conversion device 100 can be increased, and the reliability of the power conversion device 100 is improved.

As shown in FIG. 1, each power module 3 is thermally connected to the cooling surface 6. In the present embodiment, a one-side surface of the rectangular plate-shaped body portion 3*a* is in contact with the cooling surface 6. Since the power module 3 is thermally connected to the cooling surface 6, the power module 3 is effectively cooled. A heat transfer member may be provided between the power module 3 and the cooling surface 6. The positive-side terminal 3*b*, the negative-side terminal 3*c*, the winding connection terminal 3*d*, and the control terminal 3*e* of the power module 3 extend from ends of the body portion 3*a*, in a direction away from the cooling surface 6.

As described above, in the power conversion device 100 according to the first embodiment, the thickness X1 of the heat transfer member 21 between the capacitor cell 13 and the portion, of the cooling surface 6, to which the capacitor cell 13 is thermally connected is smaller than the wall thickness Y1 of the cooler 1 between the flow path 8 and the portion, of the cooling surface 6, to which the capacitor cell 13 is thermally connected. Accordingly, cooling performance for the capacitor cell 13 can be improved. In addition, the capacitor cell 13 is directly thermally connected to the cooling surface 6 without being accommodated in another part, and thus size increase of the power conversion device 100 is suppressed. The smoothing capacitor 2 includes the substrate 12, the capacitor cells 13 mounted on the substrate 12, and the power-feeding busbar 14 connected to the capacitor cells 13 via the substrate 12, and these components are integrated with each other. Accordingly, size increase of the power conversion device 100 is suppressed as compared to the case where these components are individually formed. Further, if the substrate 12, each capacitor cell 13, and the power-feeding busbar 14 are integrated with each other, the number of steps for assembling the power conversion device 100 is reduced, and assembling workability is improved. Accordingly, the power conversion device 100 can be manufactured at low cost. Furthermore, the power-feeding busbar 14 and the capacitor cell 13 are thermally connected to the cooling surface 6 with the busbar heat transfer member 21*a* and the heat transfer member 21 therebetween, respectively. Accordingly, it is possible to improve cooling performance for the power-feeding busbar 14 and the capacitor cell 13 which are heat-generating members.

The power-feeding busbar 14 includes the positive-side busbar 14*a*, the negative-side busbar 14*b*, and the insulation member 17 provided between the positive-side busbar 14*a* and the negative-side busbar 14*b*. Thus, short-circuiting between the positive-side busbar 14*a* and the negative-side busbar 14*b* can be easily prevented. In addition, if an insulation paper sheet is used as the insulation member 17, the size of the power-feeding busbar 14 can be reduced. Further, since the positive-side busbar 14*a*, the negative-side busbar 14*b*, and the insulation member 17 are integrated with each other by the resin member 18, assembling workability for the power conversion device 100 can be improved. Further, if the positive-side busbar 14*a*, the negative-side busbar 14*b*, and the insulation member 17 are molded integrally with each other by the resin member 18, the number of steps for assembling the power-feeding busbar 14 is reduced, whereby the power-feeding busbar 14 can be produced at low cost. Furthermore, if the resin member 18 includes the projections 18*c* to be fitted into the through-holes 12*b* provided in the substrate 12, the resin member 18 can be provisionally fixed to the substrate 12. Therefore, assembling workability for the power conversion device 100 is improved, whereby the time for assembling work can be shortened. Moreover, if the resin member 18 is fixed to the cooler 1, the vibration resistance of the power-feeding busbar 14 can be improved.

If the noise-removing capacitor 16 mounted on the substrate 12 is provided, it becomes unnecessary to separately mount a noise-removing capacitor to the power conversion device 100, whereby size increase of the power conversion device 100 can be suppressed. If the magnetic core 15 enclosing the periphery of the power-feeding busbar 14 and positioned by being in contact with the resin member 18 is provided, the power-feeding busbar 14 is stably enclosed by the magnetic core 15 positioned by the resin member 18, whereby radio wave noise generated from the power conversion device 100 is efficiently suppressed. Contact between the magnetic core 15, and the positive-side busbar 14*a* and the negative-side busbar 14*b*, is inhibited, whereby radio wave noise generated from the power conversion device 100 can be suppressed.

Description has been given above based on an example where: the power conversion device 100 is a power conversion device for an AC motor; and the smoothing capacitor 2 is provided on the input side connected to the DC power supply 10. However, the power conversion device 100 may be any of various power conversion devices such as a DC-DC converter, and the smoothing capacitor 2 may be provided to any portion that needs to undergo smoothing, such as an output side connected to a load. In addition, smoothing capacitors 2 are provided at a plurality of locations on a circuit. Further, the components to which the smoothing capacitor 2 is connected is not limited to the power modules and may be, for example, a substrate including a semiconductor switching element.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent parts may be modified, added, or eliminated. At least one of the constituent parts mentioned in at least one of the preferred embodiments may be selected and combined with the constituent parts mentioned in another preferred embodiment.

DESCRIPTION OF THE REFERENCE CHARACTERS 1 cooler
1a protruding portion
2 smoothing capacitor
3 power module
3a body portion
3b positive-side terminal
3c negative-side terminal
3d winding connection terminal
3e control terminal
4 housing lid
5 housing
6 cooling surface
7 pipe
8 flow path
9 fastening member
10 DC power supply
11 three-phase AC motor
12 substrate
12a screw hole
12b through-hole
13 capacitor cell
13a flat surface portion
14 power-feeding busbar
14a positive-side busbar
14b negative-side busbar
14c positive terminal
14d negative terminal
14e positive connection terminal
14f negative connection terminal
14g cooling portion
14h linear portion
14i power supply connection portion
15 magnetic core
16 noise-removing capacitor
17 insulation member
18 resin member
18a positioning portion
18b fixation portion
18c projection
19 through-hole
20 resin member
21 heat transfer member
21a heat transfer member
100 power conversion device

What is claimed is:

1. A power conversion device comprising:
a cooler having a cooling surface on an outer side thereof and a flow path on an inner side thereof, the flow path being formed such that a coolant flows through the flow path, the outer side having a plate-like shape; and
a smoothing capacitor fixed to the cooler, the smoothing capacitor being thermally connected to the cooling surface with a heat transfer member therebetween and configured to smooth DC power, wherein
a first thickness of the heat transfer member between the smoothing capacitor and a portion, of the cooling surface, to which the smoothing capacitor is thermally connected is set to be smaller than a wall thickness of the cooler between the flow path and the portion, of the cooling surface, to which the smoothing capacitor is thermally connected, wherein the first thickness and the wall thickness are measured in a direction substantially perpendicular to the plate-like shape of the outer side of the cooling surface.

2. The power conversion device according to claim 1, wherein
the smoothing capacitor includes a substrate and a plurality of capacitor cells mounted on the substrate,
the substrate is fixed to the cooler, and
the plurality of capacitor cells are thermally connected to the cooling surface with the heat transfer member therebetween.

3. The power conversion device according to claim 2, wherein the power conversion device further comprises a noise-removing capacitor mounted on the substrate.

4. The power conversion device according to claim 2, wherein
the substrate is disposed so as to be apart from the cooling surface,
the plurality of capacitor cells are disposed between the substrate and the cooling surface,
the cooler includes a protruding portion protruding from the cooling surface, and
the substrate is fixed to the protruding portion.

5. The power conversion device according to claim 2, wherein
the substrate is disposed parallel to the cooling surface so as to be apart therefrom,
each capacitor cell has a shape of a column,
the plurality of capacitor cells are arranged along the cooling surface and the substrate,
one bottom surface of each capacitor cell having the shape of the column faces a surface, of the substrate, that is located on the cooling surface side,
a terminal provided to the one bottom surface is electrically connected to the substrate,
another bottom surface of the capacitor cell faces the cooling surface, and
the heat transfer member is interposed between the other bottom surface and the cooling surface.

6. The power conversion device according to claim 5, wherein
the smoothing capacitor includes, in addition to the substrate and the capacitor cell, a plate-shaped power-feeding busbar electrically connected to the plurality of capacitor cells via the substrate,
the power-feeding busbar includes a linear portion extending linearly along the cooling surface, and the plurality of capacitor cells are arranged along the linear portion.

7. The power conversion device according to claim 6, wherein the power-feeding busbar includes: a positive-side busbar; a negative-side busbar; and an insulation member provided between the positive-side busbar and the negative-side busbar.

8. The power conversion device according to claim 7, wherein an insulation paper sheet as the insulation member is interposed between the positive-side busbar and the negative-side busbar which are disposed parallel to each other.

9. The power conversion device according to claim 7, wherein the positive-side busbar, the negative-side busbar, and the insulation member are integrated with each other by a resin member.

10. The power conversion device according to claim 9, wherein the positive-side busbar, the negative-side busbar, and the insulation member are molded integrally with each other by the resin member.

11. The power conversion device according to claim 10, wherein
the power-feeding busbar is disposed on an end side of the substrate,
the resin member includes a fixation portion extending to a center side of the substrate from a portion, of the resin member, at which integral molding has been made, and
the fixation portion is, together with the substrate, fixed to the cooler.

12. The power conversion device according to claim 11, wherein the fixation portion includes a projection fitted into a through-hole provided in the substrate.

13. The power conversion device according to claim 9, wherein the power conversion device further comprises a magnetic core enclosing a periphery of the positive-side busbar and the negative-side busbar and positioned by the resin member.

14. The power conversion device according to claim 1, wherein
the power conversion device further comprises a power module including a semiconductor switching element, and
the power module is fixed to the cooler and thermally connected to the cooling surface.

15. A power conversion device comprising:
a cooler having a cooling surface on an outer side thereof and a flow path on an inner side thereof, the flow path being formed such that a coolant flows through the flow path; and
a smoothing capacitor fixed to the cooler, the smoothing capacitor being thermally connected to the cooling surface with a heat transfer member therebetween and configured to smooth DC power, wherein
a thickness of the heat transfer member between the smoothing capacitor and a portion, of the cooling surface, to which the smoothing capacitor is thermally connected is set to be smaller than a wall thickness of the cooler between the flow path and the portion, of the cooling surface, to which the smoothing capacitor is thermally connected, wherein the power conversion device further comprises a power module including a semiconductor switching element,
the smoothing capacitor includes
a substrate,
a plurality of capacitor cells mounted on the substrate, and
a plate-shaped power-feeding busbar electrically connected to the plurality of capacitor cells via the substrate, and
the power-feeding busbar is electrically connected to the power module, the power-feeding busbar being thermally connected to the cooling surface with a busbar heat transfer member therebetween.

16. The power conversion device according to claim 15, wherein a thickness of the busbar heat transfer member between the power-feeding busbar and a portion, of the cooling surface, to which the power-feeding busbar is thermally connected is set to be smaller than a wall thickness of the cooler between the flow path and the portion, of the cooling surface, to which the power-feeding busbar is thermally connected.

17. A power conversion device comprising:
a cooler having a cooling surface on an outer side thereof and a flow path on an inner side thereof, the flow path being formed such that a coolant flows through the flow path; and
a smoothing capacitor fixed to the cooler, the smoothing capacitor being thermally connected to the cooling surface with a heat transfer member therebetween and configured to smooth DC power, wherein
a thickness of the heat transfer member between the smoothing capacitor and a portion, of the cooling surface, to which the smoothing capacitor is thermally connected is set to be smaller than a wall thickness of the cooler between the flow path and the portion, of the cooling surface, to which the smoothing capacitor is thermally connected, wherein
the power conversion device further comprises a plurality of power modules each including a semiconductor switching element,
the plurality of power modules are fixed to the cooler and thermally connected to the cooling surface,
the smoothing capacitor includes
a substrate,
a plurality of capacitor cells mounted on the substrate, and
a plate-shaped power-feeding busbar electrically connected to the plurality of capacitor cells via the substrate,
the power-feeding busbar includes a linear portion extending linearly along the cooling surface,
the plurality of capacitor cells are arranged along the linear portion so as to be in a region, of the cooling surface, that is located on one side of the linear portion, and
the plurality of power modules are arranged along the linear portion so as to be in a region, of the cooling surface, that is located on another side of the linear portion, and are connected to portions of the linear portion.

* * * * *